United States Patent
Wang et al.

(10) Patent No.: US 8,368,057 B2
(45) Date of Patent: Feb. 5, 2013

(54) ORGANIC THIN FILM TRANSISTOR

(75) Inventors: Yu-Ping Wang, Taoyuan County (TW); Heng-Wen Ting, Pingtung County (TW); Chung-Min Tsai, Taipei (TW); Tri-Rung Yew, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 380 days.

(21) Appl. No.: 12/807,620

(22) Filed: Sep. 9, 2010

(65) Prior Publication Data
US 2011/0193065 A1 Aug. 11, 2011

(30) Foreign Application Priority Data
Feb. 11, 2010 (TW) ................ 99104382 A

(51) Int. Cl.
*H01L 29/08* (2006.01)
*H01L 51/00* (2006.01)
(52) U.S. Cl. .............. 257/40; 257/E51.006; 438/99
(58) Field of Classification Search .......... 257/40, 257/E51.006; 438/99
See application file for complete search history.

(56) References Cited

U.S. PATENT DOCUMENTS

| 2003/0047729 A1* | 3/2003 | Hirai et al. | 257/40 |
| 2004/0222412 A1* | 11/2004 | Bai et al. | 257/40 |
| 2007/0120111 A1* | 5/2007 | Nakamura et al. | 257/40 |
| 2008/0135833 A1* | 6/2008 | Shukla et al. | 257/40 |

* cited by examiner

*Primary Examiner* — Steven J Fulk
(74) *Attorney, Agent, or Firm* — Clifford W. Browning; Krieg DeVault LLP

(57) ABSTRACT

An organic thin film transistor includes: a gate electrode, a gate insulating film, a source electrode, a drain electrode, and an organic active layer. The organic active layer includes an organic semiconductor compound represented by the following formula (A) as defined in the specification.

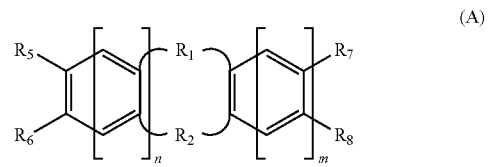

(A)

18 Claims, 4 Drawing Sheets

ORGANIC THIN FILM TRANSISTOR

CROSS-REFERENCE TO RELATED APPLICATION

This application claims priority of Taiwanese application no. 099104382, filed on Feb. 11, 2010.

BACKGROUND OF THE INVENTION

1. Field of the Invention

This invention relates to a transistor, more particularly to an organic thin film transistor.

2. Description of the Related Art

An organic thin film transistor (OTFT) is flexible, easy to manufacture, and cost effective, and thus, many researches have focused on this field in recent years.

Referring to FIG. 1, an OTFT 1 generally includes a gate insulating film 11, a source electrode 12, a drain electrode 13, a gate electrode 14, and an organic active layer 16. The source and drain electrodes 12, 13 are respectively disposed on an upper surface of the gate insulating film 11. The organic active layer 16, which includes an organic semiconductor material, is disposed on a channel portion 15 cooperatively defined by the source and drain electrodes 12, 13 and the gate insulating film 11 and is in contact with the source and drain electrodes 12, 13.

For disposing the organic semiconductor material of the organic active layer 16 onto the OTFT 1 with a large area, an ink-jet printing method is commercially preferable in view of cost effectiveness and operation convenience. The ink-jet printing method is conducted by dissolving the organic semiconductor material in a solvent to form a solution, and printing the solution onto an element (i.e., onto the gate insulating film 11 in the channel portion 15) using an ink-jet printer, followed by drying. For the ink-jet printing method, the organic semiconductor material used in the formation of the organic active layer should have a relatively high solubility in the solvent and high stability in the atmosphere.

Examples of the conventional organic semiconductor material used in the ink-jet printing method include pentacene published in M.R.S Bulletin., 2003, vol. 771, p 169, rubrene published in Nature, 2006, vol. 444, p 913, polythiophene (P3HT) published in Chemistry of Materials, 1998, vol. 10, p 457, trimethylsilyl-substituted quarterthiophene (TMS-4T) published in Advanced materials, 2008, vol. 20, p 4044, and so on. The conventional organic semiconductor materials of P3HT and TMS-4T are expectedly suitable for used in the ink-jet printing method.

Since the above-mentioned organic semiconductor materials are all hydrophobic compounds, a hydrophobic layer 112 is preferably provided between the gate insulating film 11 and the organic active layer 16 in the channel portion 15, and each of the source and drain electrodes 12, 13 is designed to be made of a hydrophilic material. Accordingly, the hydrophobic organic semiconductor material can be stably positioned in the channel portion 15, and after the same is dried, the crystal thereof can exhibit a superior crystal quality. The hydrophobic layer 112, for example, can be made of hexamethyl disilazane (HMDS) or octadecyltrichlorosilane (OTS).

However, there are several problems with respect to the above-mentioned hydrophobic organic semiconductor materials. First of all, a hydrophobic organic solvent has to be used in dissolving the aforesaid hydrophobic organic semiconductor materials. Certain hydrophobic organic solvents are likely to damage the environment and can cause health concerns to users, and thus, the equipment and space for operation of the hydrophobic organic solvents should be strictly controlled. Moreover, certain hydrophobic organic solvents are likely to damage the organic insulating films, such as PVP (poly-4-vinylphenol) in OTFTs and thus, the deposition of the organic active layer 16 using the ink-jet printing method is impeded.

In addition, the above-mentioned organic semiconductor materials are likely to be attacked by moisture or oxygen, and thus, cannot be stably stored in the atmosphere. For example, P3HT can be stored in the atmosphere for only one week, and pentacene is extremely unstable and cannot be used in the process for forming transistors under the atmosphere.

SUMMARY OF THE INVENTION

Therefore, an object of the present invention is to provide an organic thin film transistor that can overcome the aforesaid drawbacks of the prior art, in which an organic semiconductor compound used for forming an organic active layer is soluble in hydrophilic solvent, can be stored stably in the atmosphere, and can be used in the ink-jet printing method.

Accordingly, an organic thin film transistor of this invention comprises:

a gate electrode;

a gate insulating film disposed on the gate electrode;

a source electrode disposed on the gate insulating film;

a drain electrode disposed on the gate insulating film, the gate insulating film, the drain electrode, and the source electrode cooperatively defining a channel portion, the drain electrode and the source electrode being separated from each other by the channel portion; and an organic active layer that is disposed on the gate insulating film in the channel portion and that is in contact with the source electrode and the drain electrode, wherein the organic active layer includes an organic semiconductor compound represented by the following formula (A):

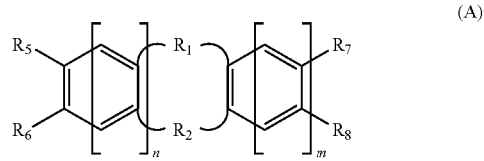

(A)

wherein m is 1 or 2; n is 1 or 2, $R_1$ is a carbonyl group or

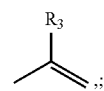

and $R_2$ is a carbonyl group or

and $R_3$ and $R_4$ being independently H or —C≡C—Si(CH$_3$)$_2$)$_3$;

wherein $R_5$, $R_6$, $R_7$, and $R_8$ are independently hydrogen, a carboxyl group, a halogen-containing group, an ester group, a nitro group, or an aldehyde group; or $R_5$ and $R_6$ together form —(C=O)—O—(C=O)— or

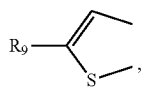

$R_7$ and $R_8$ being independently hydrogen, a carboxyl group, a halogen-containing group, an ester group, a nitro group, or an aldehyde group, $R_9$ being an aldehyde group, an ester group, or a nitro group; or $R_7$ and $R_8$ together form —(C=O)—O—(C=O)— or

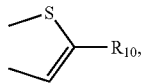

$R_5$ and $R_6$ being independently hydrogen, a carboxyl group, a halogen-containing group, an ester group, a nitro group, or an aldehyde group, $R_{10}$ being an aldehyde group, an ester group, or a nitro group.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
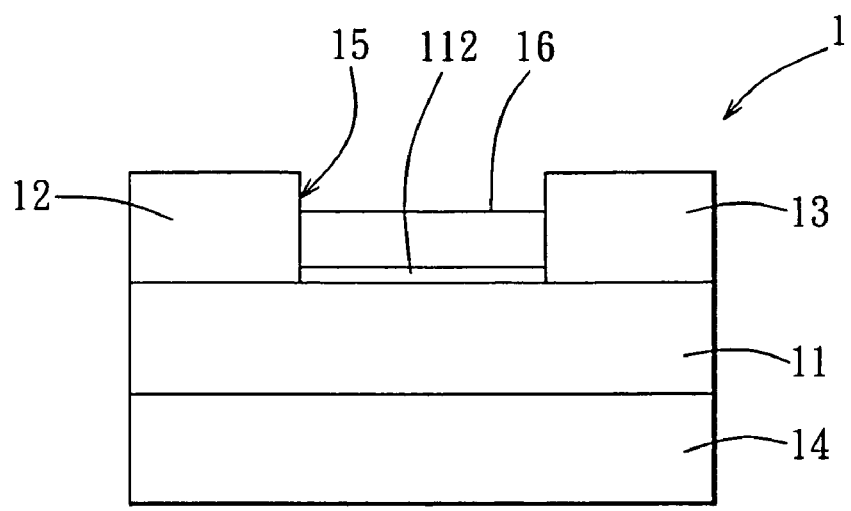
FIG. 1 is a schematic view for illustrating a conventional organic thin film transistor.

Before the present invention is described in greater detail with reference to the accompanying preferred embodiments, it should be noted herein that like elements are denoted by the same reference numerals throughout the disclosure.

Figure 2:
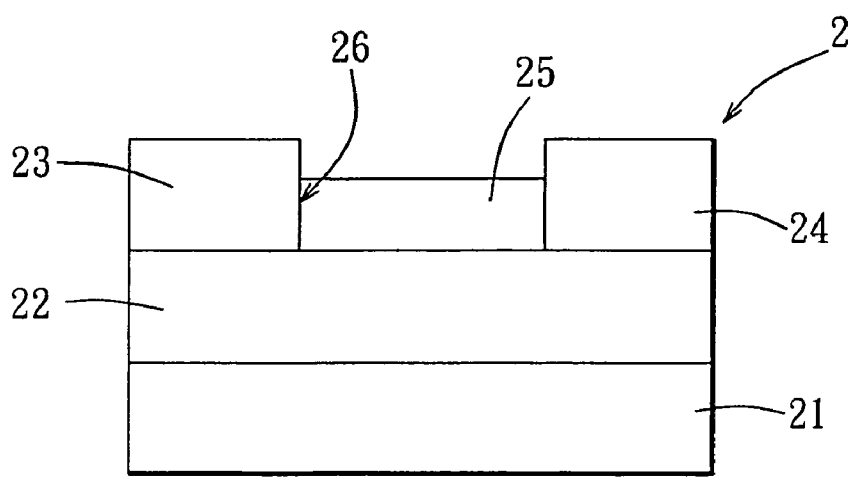
FIG. 2 is a schematic view for illustrating the first preferred embodiment of an organic thin film transistor according to the present invention.

Referring to FIG. 2, the first preferred embodiment of an organic thin film transistor (OTFT) 2 according to the present invention includes a gate electrode 21, a gate insulating film 22, a source electrode 23, a drain electrode 24, and an organic active layer 25.

The gate insulating film 22 is disposed on the gate electrode 21. The source electrode 23 is disposed on one side of the gate insulating film 22. The drain electrode 24 is disposed on the other side of the gate insulating film 22 opposite to the source electrode 23. The gate insulating film 22, the drain electrode 24, and the source electrode 23 cooperatively define a channel portion 26. That is to say, the drain electrode 24 and the source electrode 23 are separated from each other by the channel portion 26. The organic active layer 25 is disposed on the gate insulating film 22 in the channel portion 26 and is in contact with the source electrode 23 and the drain electrode 24. The technical feature of the present invention resides in that the organic active layer 25 includes an organic semiconductor compound represented by the following formula (A):

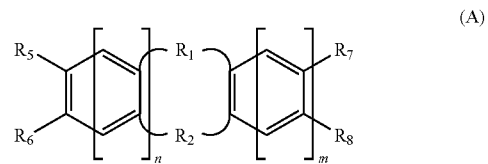

(A)

wherein m is 1 or 2; n is 1 or 2, $R_1$ is a carbonyl group or

and $R_2$ is a carbonyl group or

$R_3$ and $R_4$ being independently H or —C≡C—Si(CH(CH$_3$)$_2$)$_3$;

wherein $R_5$, $R_6$, $R_7$, and $R_9$ are independently hydrogen, a carboxyl group, a halogen-containing group, an ester group, a nitro group, or an aldehyde group; or $R_5$ and $R_6$ together form —(C=O)—O—(C=O)— or

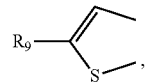

$R_7$ and $R_8$ being independently hydrogen, a carboxyl group, a halogen-containing group, an ester group, a nitro group, or an aldehyde group, $R_9$ being an aldehyde group, an ester group, or a nitro group; or $R_7$ and $R_8$ together form —(C=O)—O—(C=O)— or

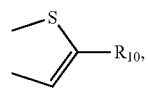

$R_5$ and $R_6$ being independently hydrogen, a carboxyl group, a halogen-containing group, an ester group, a nitro group, or an aldehyde group, $R_{10}$ being an aldehyde group, an ester group, or a nitro group.

As shown in the formula (A), the organic semiconductor compound includes four substituted branch groups (i.e., $R_5$, $R_6$, $R_7$ and $R_8$) and a main group connected to the four substituted branch groups. Since m and n are independently 1 or 2, the main group is a fused ring structure having three to five rings. The four substituted branch groups include functional groups beneficial to form attractive forces with water molecules.

Table 1 shows the exemplified organic semiconductor compounds of this invention. In the compounds of nos. 1 to 66, m and n are 1, i.e., the main group is a three-fused-ring structure. In the compounds of nos. 67 to 99, m is 2 and n is 1, i.e., the main group is a four-fused-ring structure. In the compounds of nos. 100 to 149, m and n are 2, i.e., the main group is a five-fused-ring structure.

In the compounds of nos. 34 to 66, $R_1$ and $R_2$ are independently a carbonyl group. In the compounds of nos. 1 to 33 and 67 to 134, $R_1$ is

$R_2$ is

and $R_3$ and $R_4$ are H (i.e., each of $R_1$ and $R_2$ is a —CH= group). In the compounds of nos. 135 to 149, $R_1$ is

$R_2$ is

and $R_3$ and $R_4$ are —C≡C—Si(CH($CH_3$)$_2$)$_3$.

Preferably, the halogen-containing group is $CF_3$, F, or Cl. Preferably, the ester group is $H_3C$—O—(C=O)— or $F_3C$—O—(C=O)—.

In some examples of this invention, $R_5$ and $R_8$ are the same functional group, and $R_6$ and $R_7$ are the same functional group, but the functional group of $R_5$ and $R_8$ is different from that of $R_6$ and $R_7$, e.g., the compounds of nos. 12 to 15 in Table 1.

In some examples of this invention, $R_5$ and $R_6$ are the same functional group, and $R_7$ and $R_8$ are the same functional group, the functional group of $R_5$ and $R_6$ is different from that of $R_7$ and $R_8$, e.g., the compounds of nos. 28 to 29 in Table 1.

In some examples of this invention, $R_5$, $R_6$, $R_7$ and $R_8$ are the same functional group, e.g., the compounds of nos. 11 and 16 in Table 1.

In some examples of this invention, $R_7$ and $R_8$ together form a —(C=O)—O—(C=O)— group, and $R_5$ and $R_6$ are the same functional group, e.g., the compounds of nos. 32 and 33 in Table 1.

In some examples of this invention, $R_5$ and $R_6$ together form a

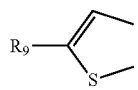

group, $R_7$ and $R_8$ together form a

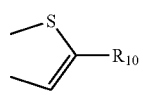

group, and $R_9$ and $R_{10}$ are the same functional group, e.g., the compounds of nos. 132 to 134 in Table 1.

In Table 1, the —C≡C—Si (CH($CH_3$)$_2$)$_3$ group is represented by

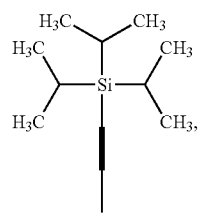

the —(C=O)—O—(C=O)— group is represented by

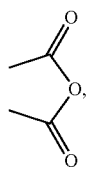

and the $H_3C$—O—(C=O)— group and the $F_3C$—O—(C=O)— group are respectively represented by

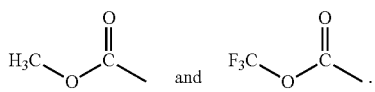

TABLE 1

| No. | n | m | $R_1$ | $R_2$ | $R_3$ | $R_4$ | $R_5$ | $R_6$ | $R_7$ | $R_8$ | $R_9$ | $R_{10}$ |
|---|---|---|---|---|---|---|---|---|---|---|---|---|
| 1 | 1 | 1 |  (R₃/R₄) |  | H | H | 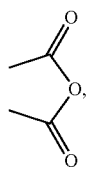 (H-C=O) | | | | — | — |

TABLE 1-continued
| No. | n | m | R₁ | R₂ | R₃ | R₄ | R₅ | R₆ | R₇ | R₈ | R₉ | R₁₀ |
|---|---|---|---|---|---|---|---|---|---|---|---|---|
| 2 | 1 | 1 | | | H | H |  | H | H |  | — | — |
| 3 | 1 | 1 | | | H | H | | —CF₃ | —CF₃ | | — | — |
| 4 | 1 | 1 | | | H | H | | F | F | | — | — |
| 5 | 1 | 1 | | | H | H | | Cl | Cl | | — | — |
| 6 | 1 | 1 | | | H | H |  | | | | — | — |
| 7 | 1 | 1 | | | H | H |  | H | H |  | — | — |
| 8 | 1 | 1 | | | H | H | | —CF₃ | —CF₃ | | — | — |
| 9 | 1 | 1 | | | H | H | | F | F | | — | — |
| 10 | 1 | 1 | | | H | H | | Cl | Cl | | — | — |
| 11 | 1 | 1 | | | H | H |  | | | | — | — |
| 12 | 1 | 1 | | | H | H | 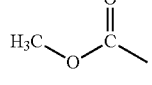 | H | H | 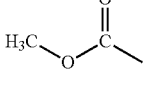 | — | — |
| 13 | 1 | 1 | | | H | H | | —CF₃ | —CF₃ | | — | — |
| 14 | 1 | 1 | | | H | H | | F | F | | — | — |
| 15 | 1 | 1 | | | H | H | | Cl | Cl | | — | — |
| 16 | 1 | 1 | | | H | H |  | | | | — | — |
| 17 | 1 | 1 | | | H | H | 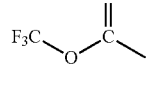 | H | H | 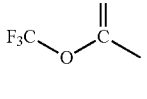 | — | — |
| 18 | 1 | 1 | | | H | H | | —CF₃ | —CF₃ | | — | — |
| 19 | 1 | 1 | | | H | H | | F | F | | — | — |
| 20 | 1 | 1 | | | H | H | | Cl | Cl | | — | — |
| 21 | 1 | 1 | | | H | H | | —NO₂ | | | — | — |
| 22 | 1 | 1 | | | H | H | —NO₂ | H | H | —NO₂ | — | — |
| 23 | 1 | 1 | | | H | H | | —CF₃ | —CF₃ | | — | — |
| 24 | 1 | 1 | | | H | H | | F | F | | — | — |
| 25 | 1 | 1 | | | H | H | | Cl | Cl | | — | — |
| 26 | 1 | 1 | | | H | H |  | | H | H | — | — |
| 27 | 1 | 1 | | | H | H |  | | H | H | — | — |
| 28 | 1 | 1 | | | H | H |  | | H | H | — | — |
| 29 | 1 | 1 | | | H | H | —NO₂ | | H | H | — | — |

TABLE 1-continued
| No. | n | m | R₁ | R₂ | R₃ | R₄ | R₅ | R₆ | R₇ | R₈ | R₉ | R₁₀ |
|---|---|---|---|---|---|---|---|---|---|---|---|---|
| 30 | 1 | 1 |  |  | H | H |  | | | Together form 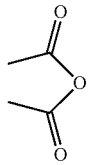 | — | — |
| 31 | 1 | 1 | | | H | H |  | | | | — | — |
| 32 | 1 | 1 | | | H | H | 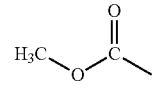 | | | | — | — |
| 33 | 1 | 1 | | | H | H | —NO₂ | | | | — | — |
| 34 | 1 | 1 |  |  | — | — |  | | | | — | — |
| 35 | 1 | 1 | | | — | — |  | H | H |  | — | — |
| 36 | 1 | 1 | | | — | — | | —CF₃ | —CF₃ | | — | — |
| 37 | 1 | 1 | | | — | — | | F | F | | — | — |
| 38 | 1 | 1 | | | — | — | | Cl | Cl | | — | — |
| 39 | 1 | 1 | | | — | — |  | | | | — | — |
| 40 | 1 | 1 | | | — | — |  | H | H |  | — | — |
| 41 | 1 | 1 | | | — | — | | —CF₃ | —CF₃ | | — | — |
| 42 | 1 | 1 | | | — | — | | F | F | | — | — |
| 43 | 1 | 1 | | | — | — | | Cl | Cl | | — | — |
| 44 | 1 | 1 | | | — | — | 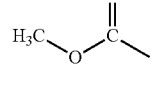 | | | | — | — |
| 45 | 1 | 1 | | | — | — | 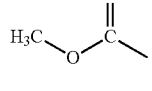 | H | H | 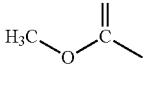 | — | — |
| 46 | 1 | 1 | | | — | — | | —CF₃ | —CF₃ | | — | — |
| 47 | 1 | 1 | | | — | — | | F | F | | — | — |
| 48 | 1 | 1 | | | — | — | | Cl | Cl | | — | — |
| 49 | 1 | 1 | | | — | — | 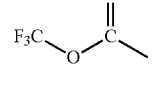 | | | | — | — |
| 50 | 1 | 1 | | | — | — | 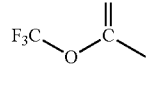 | H | H | 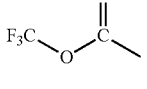 | — | — |
| 51 | 1 | 1 | | | — | — | | —CF₃ | —CF₃ | | — | — |
| 52 | 1 | 1 | | | — | — | | F | F | | — | — |
| 53 | 1 | 1 | | | — | — | | Cl | Cl | | — | — |
| 54 | 1 | 1 | | | — | — | —NO₂ | | | | — | — |

TABLE 1-continued

| No. | n | m | R₁ | R₂ | R₃ | R₄ | R₅ | R₆ | R₇ | R₈ | R₉ | R₁₀ |
|---|---|---|---|---|---|---|---|---|---|---|---|---|
| 55 | 1 | 1 | | | — | — | —NO₂ | H | H | —NO₂ | | |
| 56 | 1 | 1 | | | — | — | | —CF₃ | —CF₃ | | | |
| 57 | 1 | 1 | ![acetone] | ![acetone] | — | — | —NO₂ | F | F | —NO₂ | — | — |
| 58 | 1 | 1 | | | — | — | | Cl | Cl | | — | — |
| 59 | 1 | 1 | | | — | — | CHO | H | H | | — | — |
| 60 | 1 | 1 | | | — | — | COOH | H | H | | — | — |
| 61 | 1 | 1 | | | — | — | COOCH₃ | H | H | | — | — |
| 62 | 1 | 1 | | | — | — | —NO₂ | H | H | | — | — |
| 63 | 1 | 1 | | | — | — | CHO | Together form acetic anhydride | | | — | — |
| 64 | 1 | 1 | | | — | — | COOH | | | | — | — |
| 65 | 1 | 1 | | | — | — | COOCH₃ | | | | — | — |
| 66 | 1 | 1 | | | — | — | —NO₂ | | | | — | — |
| 67 | 1 | 2 | ![R₃ alkene] | ![R₄ alkene] | H | H | | CHO | | | — | — |
| 68 | 1 | 2 | | | H | H | CHO | H | H | CHO | — | — |
| 69 | 1 | 2 | | | H | H | | —CF₃ | —CF₃ | | — | — |
| 70 | 1 | 2 | | | H | H | | F | F | | — | — |
| 71 | 1 | 2 | | | H | H | | Cl | Cl | | — | — |
| 72 | 1 | 2 | | | H | H | | COOH | | | — | — |
| 73 | 1 | 2 | | | H | H | COOH | H | H | COOH | — | — |
| 74 | 1 | 2 | | | H | H | | —CF₃ | —CF₃ | | — | — |
| 75 | 1 | 2 | | | H | H | | F | F | | — | — |
| 76 | 1 | 2 | | | H | H | | Cl | Cl | | — | — |

TABLE 1-continued
| No. | n | m | R₁ | R₂ | R₃ | R₄ | R₅ | R₆ | R₇ | R₈ | R₉ | R₁₀ |
|---|---|---|---|---|---|---|---|---|---|---|---|---|
| 77 | 1 | 2 | | | H | H | | H₃C-O-C(=O)- | | | — | — |
| 78 | 1 | 2 | | | H | H | H₃C-O-C(=O)- | H | H | H₃C-O-C(=O)- | — | — |
| 79 | 1 | 2 | | | H | H | | —CF₃ | —CF₃ | | — | — |
| 80 | 1 | 2 | | | H | H | | F | F | | — | — |
| 81 | 1 | 2 | | | H | H | | Cl | Cl | | — | — |
| 82 | 1 | 2 | | | H | H | | F₃C-O-C(=O)- | | | — | — |
| 83 | 1 | 2 | 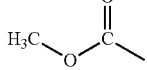 | 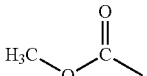 | H | H | F₃C-O-C(=O)- | H | H | F₃C-O-C(=O)- | — | — |
| 84 | 1 | 2 | | | H | H | | —CF₃ | —CF₃ | | — | — |
| 85 | 1 | 2 | | | H | H | | F | F | | — | — |
| 86 | 1 | 2 | | | H | H | | Cl | Cl | | — | — |
| 87 | 1 | 2 | | | H | H | | —NO₂ | | | — | — |
| 88 | 1 | 2 | | | H | H | —NO₂ | H | H | —NO₂ | — | — |
| 89 | 1 | 2 | | | H | H | | —CF₃ | —CF₃ | | — | — |
| 90 | 1 | 2 | | | H | H | | F | F | | — | — |
| 91 | 1 | 2 | | | H | H | | Cl | Cl | | — | — |
| 92 | 1 | 2 | | | H | H | H-C(=O)- | | H | H | — | — |
| 93 | 1 | 2 | | | H | H | HO-C(=O)- | | H | H | — | — |
| 94 | 1 | 2 | | | H | H | H₃C-O-C(=O)- | | H | H | — | — |
| 95 | 1 | 2 | | | H | H | —NO₂ | | H | H | — | — |
| 96 | 1 | 2 | | | H | H | H-C(=O)- | | Together form acetic anhydride | | — | — |
| 97 | 1 | 2 | | | H | H | HO-C(=O)- | | | | — | — |
| 98 | 1 | 2 | | | H | H | H₃C-O-C(=O)- | | | | — | — |
| 99 | 1 | 2 | | | H | H | —NO₂ | | | | — | — |
| 100 | 2 | 2 | | | H | H | H-C(=O)- | | | | — | — |

TABLE 1-continued

| No. | n | m | R₁ | R₂ | R₃ | R₄ | R₅ | R₆ | R₇ | R₈ | R₉ | R₁₀ |
|---|---|---|---|---|---|---|---|---|---|---|---|---|
| 101 | 2 | 2 | | | H | H | —CHO | H | H | —CHO | — | — |
| 102 | 2 | 2 | | | H | H | | —CF₃ | —CF₃ | | — | — |
| 103 | 2 | 2 | | | H | H | | F | F | | — | — |
| 104 | 2 | 2 | | | H | H | | Cl | Cl | | — | — |
| 105 | 2 | 2 | | | H | H | —COOH | | | | — | — |
| 106 | 2 | 2 | | | H | H | —COOH | H | H | —COOH | — | — |
| 107 | 2 | 2 | | | H | H | | —CF₃ | —CF₃ | | — | — |
| 108 | 2 | 2 | | | H | H | | F | F | | — | — |
| 109 | 2 | 2 | | | H | H | | Cl | Cl | | — | — |
| 110 | 2 | 2 | (R₃)C(=CH₂)CH₃ | (R₄)C(=CH₂)CH₃ | H | H | —C(=O)OCH₃ | | | | — | — |
| 111 | 2 | 2 | | | H | H | —C(=O)OCH₃ | H | H | —C(=O)OCH₃ | — | — |
| 112 | 2 | 2 | | | H | H | | —CF₃ | —CF₃ | | — | — |
| 113 | 2 | 2 | | | H | H | | F | F | | — | — |
| 114 | 2 | 2 | | | H | H | | Cl | Cl | | — | — |
| 115 | 2 | 2 | | | H | H | —C(=O)OCH₂CF₃ | | | | — | — |
| 116 | 2 | 2 | | | H | H | —C(=O)OCH₂CF₃ | H | H | —C(=O)OCH₂CF₃ | — | — |
| 117 | 2 | 2 | | | H | H | | —CF₃ | —CF₃ | | — | — |
| 118 | 2 | 2 | | | H | H | | F | F | | — | — |
| 119 | 2 | 2 | | | H | H | | Cl | Cl | | — | — |
| 120 | 2 | 2 | | | H | H | | —NO₂ | —NO₂ | | — | — |
| 121 | 2 | 2 | | | H | H | —NO₂ | H | H | —NO₂ | — | — |
| 122 | 2 | 2 | | | H | H | | —CF₃ | —CF₃ | | — | — |
| 123 | 2 | 2 | | | H | H | | F | F | | — | — |
| 124 | 2 | 2 | | | H | H | | Cl | Cl | | — | — |
| 125 | 2 | 2 | | | H | H | —CHO | H | H | | — | — |
| 126 | 2 | 2 | | | H | H | —COOH | H | H | | — | — |
| 127 | 2 | 2 | | | H | H | —C(=O)OCH₃ | H | H | | — | — |
| 128 | 2 | 2 | | | H | H | —NO₂ | H | H | | — | — |
| 129 | 2 | 2 | | | H | H | —CHO | H | H | | — | — |

TABLE 1-continued

| No. | n | m | R₁ | R₂ | R₃ | R₄ | R₅ | R₆ | R₇ | R₈ | R₉ | R₁₀ |
|---|---|---|---|---|---|---|---|---|---|---|---|---|
| 130 | 2 | 2 | | | H | H | Together form R₉—(thiophene) | | Together form (thiophene)—R₁₀ | | H–C(=O)– | |
| 131 | 2 | 2 | | | H | H | | | | | HO–C(=O)– | |
| 132 | 2 | 2 | | | H | H | | | | | H₃C–O–C(=O)– | |
| 133 | 2 | 2 | | | H | H | | | | | F₃C–O–C(=O)– | |
| 134 | 2 | 2 | | | H | H | | | | | —NO₂ | |
| 135 | 2 | 2 | R₃–(isopropenyl) | (isopropenyl)–R₄ | H₃C,CH₃ / H₃C,CH₃ / H₃C,CH₃ triisopropylsilyl | | H–C(=O)– | | | | — | — |
| 136 | 2 | 2 | | | | | H–C(=O)– | H | H | H–C(=O)– | — | — |
| 137 | 2 | 2 | | | | | —CF₃ | —CF₃ | | | — | — |
| 138 | 2 | 2 | | | | | F | F | | | — | — |
| 139 | 2 | 2 | | | | | Cl | Cl | | | — | — |
| 140 | 2 | 2 | | | | | HO–C(=O)– | | | | — | — |
| 141 | 2 | 2 | | | | | HO–C(=O)– | H | H | HO–C(=O)– | — | — |
| 142 | 2 | 2 | | | | | | —CF₃ | —CF₃ | | — | — |
| 143 | 2 | 2 | | | | | | F | F | | — | — |
| 144 | 2 | 2 | | | | | | Cl | Cl | | — | — |
| 145 | 2 | 2 | | | | | | —NO₂ | | | — | — |
| 146 | 2 | 2 | | | | | —NO₂ | H | H | —NO₂ | — | — |
| 147 | 2 | 2 | | | | | | —CF₃ | —CF₃ | | — | — |
| 148 | 2 | 2 | | | | | | F | F | | — | — |
| 149 | 2 | 2 | | | | | | Cl | Cl | | — | — |

The method for manufacturing the organic thin film transistor shown in FIG. 2 includes:

(a) providing a semi-finished organic thin film transistor including:

a gate electrode;

a gate insulating film disposed on the gate electrode;

a source electrode disposed on the gate insulating film; and a drain electrode disposed on the gate insulating film, the gate insulating film, the drain electrode, and the source electrode cooperatively defining a channel portion, the drain electrode and the source electrode being separated from each other by the channel portion; and (b) forming an organic active layer on the gate insulating film in the channel portion by applying an organic semiconductor solution containing the aforesaid organic semiconductor compound of formula (A) into the channel portion of the semi-finished organic thin film transistor. The organic semiconductor solution can be made by solving the aforesaid organic semiconductor compound in water or a hydrophilic organic solvent, for example, dimethyl sulfoxide (DMSO), dimethylformamide (DMF), dimethyl acetamide (DMAC), alkaline water etc.

Figure 3:
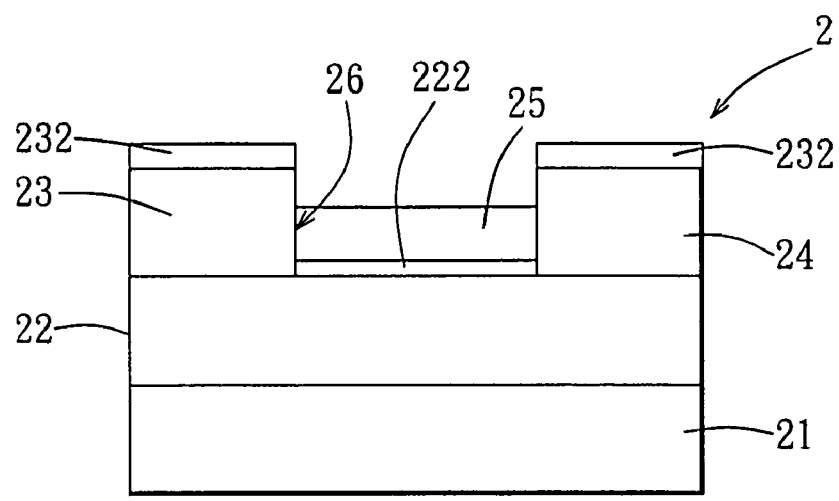
FIG. 3 is a schematic view for illustrating the second preferred embodiment of an organic thin film transistor according to the present invention.

FIG. 3 illustrates the second preferred embodiment of an organic thin film transistor (OTFT) 2 according to the present invention. The second preferred embodiment differs from the first preferred embodiment only in that the OTFT 2 further includes a hydrophilic layer 222 and a hydrophobic layer 232. The hydrophilic layer 222 is disposed between the gate insulating film 22 and the organic active layer 25 in the channel portion 26. The hydrophobic layer 232 is disposed on the source electrode 23 and the drain electrode 24. The formation of the hydrophilic layer 222 and the hydrophobic layer 232 facilitates the hydrophilic organic semiconductor compound to be stably deposited in the channel portion 26. The hydrophilic layer 222 is made of, for example, 3-aminopropyltriethoxysilane (APTES). The hydrophobic layer 232 is made of 1-dodecanethiol (DDT), 1-octanethiol (ODT), 1-hexadecanethiol (HDT), 2-butanethiol, or combinations thereof.

In practice, it is possible to form only one of the hydrophilic layer 222 and the hydrophobic layer 232 in the OTFT 2.

Figure 4:
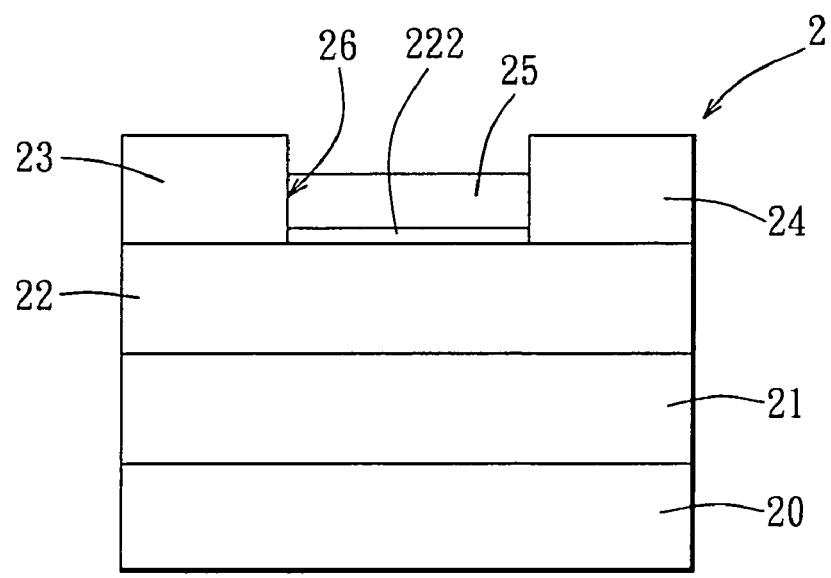
FIG. 4 is a schematic view for illustrating the third preferred embodiment of an organic thin film transistor according to the present invention.

FIG. 4 illustrates the third preferred embodiment of an organic thin film transistor (OTFT) 2 according to the present invention. The third preferred embodiment differs from the first preferred embodiment in that the OTFT 2 further includes a hydrophilic layer 222 formed between the gate insulating film 22 and the organic active layer 25 in the channel portion 26, and a substrate 20 on the gate electrode 21 opposite to the gate insulating film 22. The substrate 20 is made of, e.g., a hard material of silicon, polyimide (PI), polystyrene (PS), polymethylmethacrylate (PMMA), or polyethylene terephthalate (PET).

The present invention is explained in more detail below by way of the following examples. The chemicals and equipments used in the examples are as follows.

<Materials and Equipments>

1. Low-resistivity n$^+$-Si substrate (0.02 Ω-cm ~0.05 Ω-cm): available from Golden In Enterprise Co., Ltd.;
2. APTES: trade name: A3648-100ML, available from Sigma Aldrich Co.;
3. DDT: trade name: 471364-100ML, available from Sigma Aldrich Co.;
4. Toluene anhydrous: available from Sigma Aldrich Co.;
5. Ethanol: available from Sigma Aldrich Co.;
6. Photoresist: trade name EPG512, available from Everlight Chemical Industrial Corp.;
7. High-resolution field emission scanning electron microscope and Energy dispersive Spectrometer (SEM & EDS): model no.: S-4700I, available from Hitachi; and
8. Semiconductor parameter analyzer: model no.: HP-4155, available from Agilent Technologies.

<Processes for Forming a Semi-Finished Organic Thin Film Transistor (OTFT)>

On a first surface of a n$^+$-Si substrate, a silicon dioxide (SiO$_2$) layer, serving as a gate insulating film and having a thickness of 500 nm and a capacitance of 3.5×10$^{-9}$ F/cm$^2$, was formed by using a tube furnace. A second surface of the n$^+$-Si substrate opposite to the first surface was treated with hydrofluoric acid (HF) to remove silicon dioxide thereon so as to expose the n$^+$-Si substrate serving as a gate electrode.

A photoresist was coated onto a top surface of the gate insulating film followed by drying the photoresist to form a photoresist layer. The photoresist layer was subjected to exposure and development processes so as to remove the photoresist located at two opposite sides of the top surface of the gate insulating film. Then, gold was deposited on the two opposite portions that are not covered by the photoresist layer by using an electron-beam evaporator under 2.0×10$^{-6}$ torr so as to form the source and drain electrodes. The remaining photoresist was removed by ultrasonic vibration in acetone, followed by treatment with oxygen plasma at a power of 200 watts for 20 minutes. Thereafter, a channel portion cooperatively defined by the source and drain electrodes and the gate insulating film was thus formed. By the above steps, the semi-finished OTFT was obtained.

Example 1

A toluene solution including APTES was applied to the channel portion of the semi-finished OTFT, followed by drying so as to form a hydrophilic layer disposed on the gate insulating film in the channel portion. An ethanol solution including DDT was applied to top surfaces of the source and drain electrodes, followed by drying so as to form a hydrophobic layer disposed on the source and drain electrodes. 2,3,6,7-anthracenetetracarboxylic acid synthesized using a method disclosed in J. Org. Chem. 1994, vol. 59, pages 6484-6486 (see the last paragraph in the left column of page 6485) was used as an organic semiconductor compound for an organic active layer. The 2,3,6,7-anthracenetetracarboxylic acid thus obtained can be dissolved in water at a concentration of 6 mg/mL (25° C.) and is represented by the following formula:

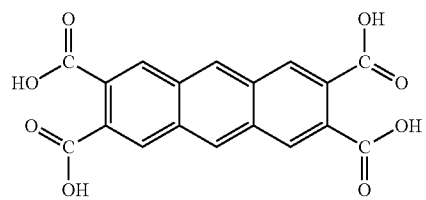 [SMILES: O=C(O)c1cc2cc3cc(C(=O)O)c(C(=O)O)cc3cc2cc1C(=O)O]

Figure 5:
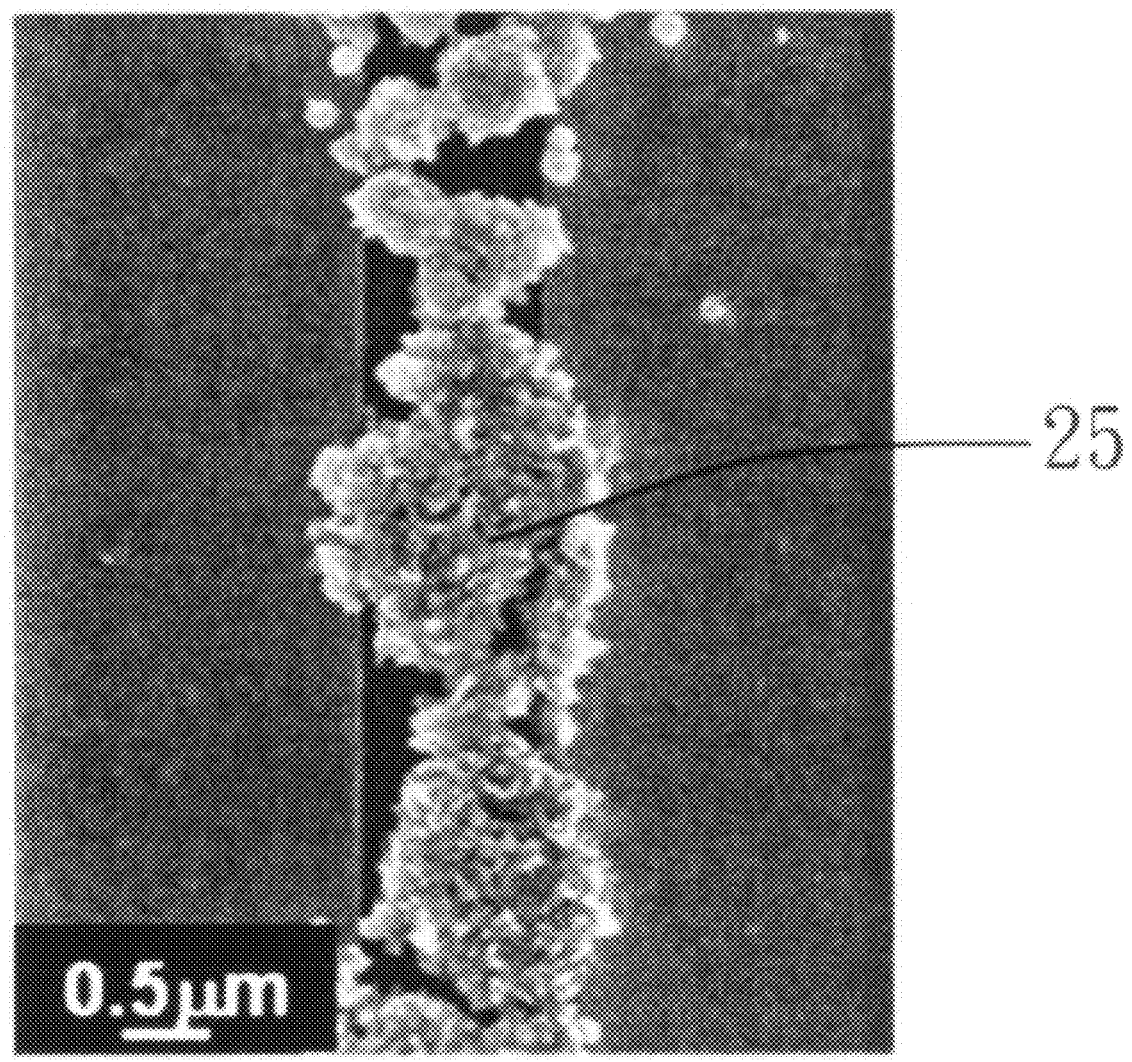
FIG. 5 is a photograph of a top fragmentary view of an organic thin film transistor according to the present invention, showing an organic active layer formed in a channel portion by crystallizing a solution of 2,3,6,7-anthracenetetracarboxylic acid.

In this example, 2,3,6,7-anthracenetetracarboxylic acid was dissolved in water, and the aqueous solution of 2,3,6,7-anthracenetetracarboxylic acid was applied into the channel portion of the semi-finished OTFT, followed by drying and crystallization so as to form the organic active layer as shown in FIG. 5. Accordingly, a structure shown in the OTFT 2 of FIG. 3 was formed.

Figure 6:
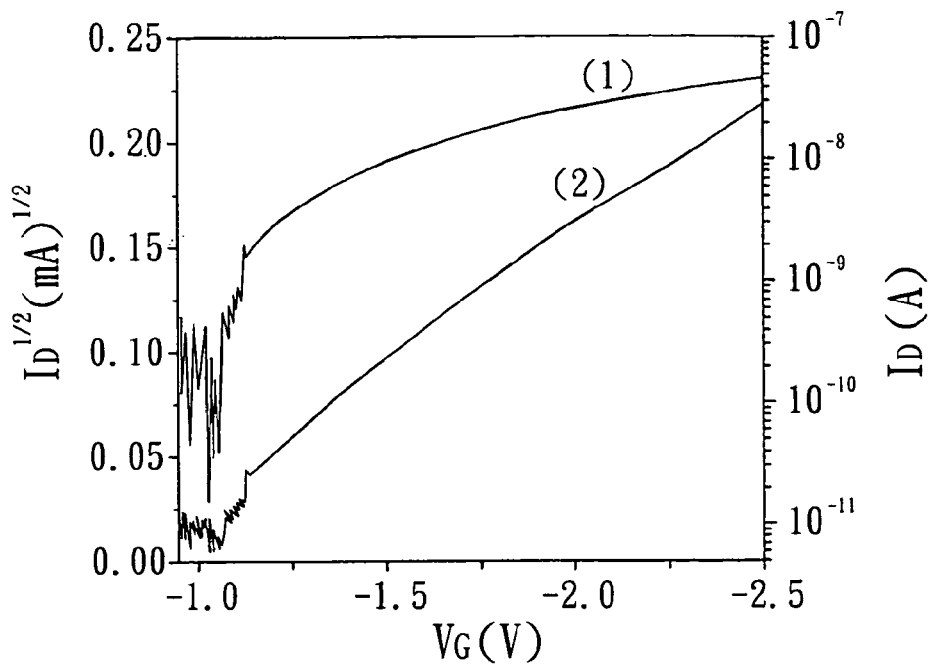
FIG. 6 is an I-V characteristic plot illustrating $I_D$ versus $V_G$ and $I_D^{1/2}$ versus $V_G$ characteristics for Example 1 of the present invention.

FIG. 6 is a graph showing test results for I-V characteristics of the OTFT of Example 1 using the semiconductor parameter analyzer. In FIG. 6, the variation of the drain current (I$_D$) with the changes of the gate voltage (V$_G$) ranging from −0.8 volt to −2.5 volts was recorded to obtain the curve (1). The curve (2) in FIG. 6 was obtained by plotting V$_G$ versus the square root of I$_D$, i.e., I$_D^{1/2}$. The result shows that I$_D^{1/2}$ is proportional to V$_G$. Since the operation of a theoretical OTFT should be consistent with the equation (I) and since the result of the OTFT of this invention, i.e., I$_D^{1/2}$ is proportional to V$_G$, also conforms with the equation (I), the OTFT of this invention can be deemed an operable and successful transistor.

$$\sqrt{I_D} = \sqrt{\frac{WC_i}{2L} \mu} \, (V_G - V_T) \tag{I}$$

wherein I$_D$ means the drain current, L means a length of the channel portion between the drain and source electrodes, W means a width of the channel portion, C$_i$ means a capacitance of the gate insulating film per unit area (C$_i$ of SiO$_2$=10 nF/cm$^2$), μ means field effect mobility of the Example 1 of the OTFT, and V$_T$ means threshold voltage of the Example 1 of the OTFT.

Based on equation (I), the field effect mobility (μ) and the threshold voltage (V$_T$) for the organic active layer of Example 1 can be calculated. The field effect mobility (μ) is 0.12 cm$^2$/V-s, and the threshold voltage (V$_T$) is −1 volt. The I$_{on}$/I$_{off}$ ratio for the organic active layer of Example 1 is about $10^2$ and is calculated by dividing the drain current (about $5×10^{-8}$ A) at gate voltage of –1.0 volt by the drain current (about $5×10^{-10}$ A) at gate voltage of –2.5 volt (see FIG. 6).

Example 2

Figure 7:
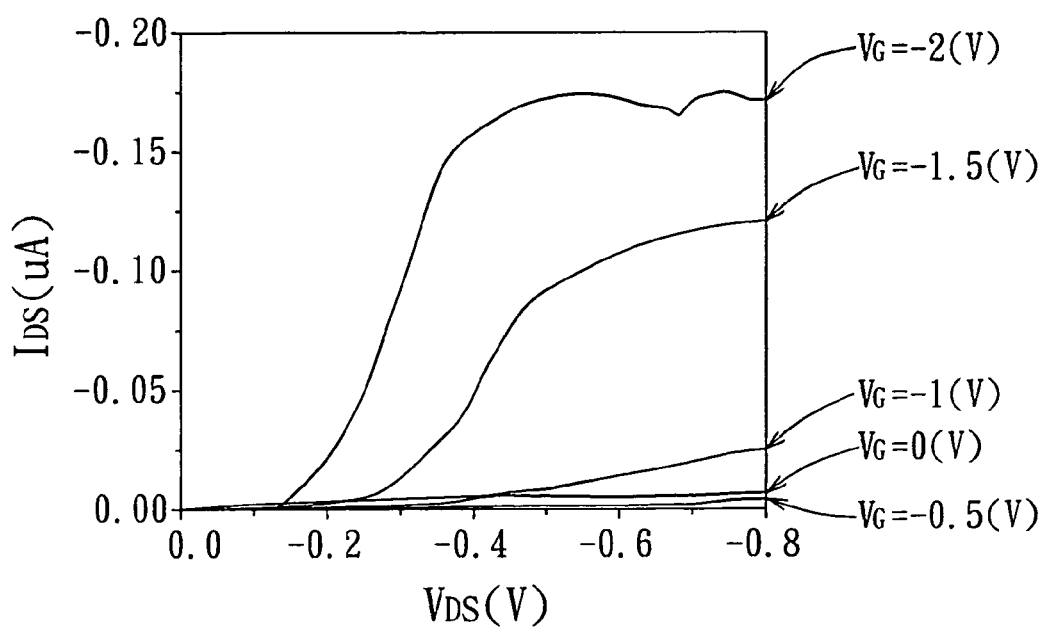
FIG. 7 is an I-V characteristic plot illustrating $I_{DS}$ versus $V_{DS}$ characteristics at different gate voltages for Example 2 of the present invention.

The OTFT of Example 2 was prepared by the same steps of those of Example 1 except that, before forming the organic active layer, 2,3,6,7-anthracenetetracarboxylic acid used in the Example 2 was stored at the atmosphere (25° C., humidity of 60%) for 7 days after synthesizing the same. FIG. 7 shows the I-V characteristic graph (drain-source current ($I_{DS}$) versus drain-source voltage ($V_{DS}$)) for Example 2 of the present invention. In FIG. 7, the drain-source current ($I_{DS}$) is equal to the drain current ($I_D$) shown in equation (I).

In FIG. 7, the $I_{DS}$-$V_{DS}$ curves at different gate voltages ($V_G$) of –0.5V, 0 v, –1V, –1.5V, –2V, were obtained. As shown in FIG. 7, when the gate voltage ($V_G$) increases, the source-drain current ($I_{DS}$) increases with the rising amount of the drain-source voltage ($V_{DS}$). The larger the increase in the gate voltage ($V_G$), the more apparent will be the rising amount of the source-drain current ($I_{DS}$). Furthermore, the field effect mobility ($\mu$), the threshold voltage ($V_T$), and the on/off ratio for the organic active layer of Example 2, which were calculated based on the above equation (I) and the curves of FIG. 7, were similar to those of Example 1. This reveals that 2,3,6,7-anthracenetetracarboxylic acid which has been stored in the atmosphere for 7 days is still suitable for use in making an organic thin film transistor. According to experiments conducted by the inventors, 2,3,6,7-anthracenetetracarboxylic acid stored at the atmosphere for 40 days can still function as the organic semiconductor compound for the OTFT.

As shown in FIG. 7, since the source-drain current ($I_{DS}$) increasing with the rising amount of the drain-source voltage ($V_{DS}$) becomes apparently when the gate voltage ($V_G$) is greater than –1 volt, i.e., –1.5 and –2 volt, the threshold voltage ($V_T$) of the Example 2 is similar to that of Example 1 and is about –1 volt, and is smaller than that of an OTFT using a conventional organic semiconductor compound. Accordingly, the inventors anticipate that the organic active layer has a relatively low trapped charge density which might be attributed to more uniform molecular arrangement for the crystals of 2,3,6,7-anthracenetetracarboxylic acid.

Since the compound of formula (A) has good solubility in water and certain hydrophilic organic solvents and superior stability in the atmosphere, the same can be used in the ink-jet printing method for manufacturing an OTFT, especially the OTFT with a large area, and is environmentally friendly. The OTFT including the organic active layer formed of the compound of formula (A) also exhibits a typical operation mode (see equation (I)) for a transistor.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. An organic thin film transistor, comprising:
a gate electrode;
a gate insulating film disposed on said gate electrode;
a source electrode disposed on said gate insulating film;
a drain electrode disposed on said gate insulating film, said gate insulating film, said drain electrode, and said source electrode cooperatively defining a channel portion, said drain electrode and said source electrode being separated from each other by said channel portion; and
an organic active layer that is disposed on said gate insulating film in said channel portion and that is in contact with said source electrode and said drain electrode,
wherein said organic active layer includes an organic semiconductor compound represented by the following formula (A):

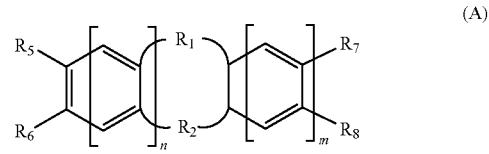

wherein m is 1 or 2; n is 1 or 2, $R_1$ is a carbonyl group or

and $R_2$ is a carbonyl group or

$R_3$ and $R_4$ being independently H or —C≡C—Si(CH(CH$_3$)$_2$)$_3$;
wherein $R_5$, $R_6$, $R_7$, and $R_8$ are independently hydrogen, a carboxyl group, a halogen-containing group, an ester group, a nitro group, or an aldehyde group; or $R_5$ and $R_6$ together form —(C═O)—O—(C═O)— or

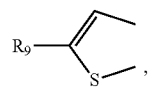

$R_7$ and $R_8$ being independently hydrogen, a carboxyl group, a halogen-containing group, an ester group, a nitro group, or an aldehyde group, $R_9$ being an aldehyde group, an ester group, or a nitro group; or $R_7$ and $R_8$ together form —(C═O)—O—(C═O)— or

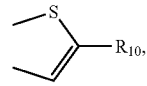

$R_5$ and $R_6$ being independently hydrogen, a carboxyl group, a halogen-containing group, an ester group, a nitro group, or an aldehyde group, $R_{10}$ being an aldehyde group, an ester group, or a nitro group.

2. The organic thin film transistor of claim 1, further comprising a hydrophilic layer disposed between said gate insulating film and said organic active layer in said channel portion.

3. The organic thin film transistor of claim 1, further comprising a hydrophobic layer disposed on said source electrode and said drain electrode opposite to said gate insulating film.

4. The organic thin film transistor of claim 1, wherein $R_1$ is a carbonyl group, and $R_2$ is a carbonyl group.

5. The organic thin film transistor of claim 1, wherein $R_1$ is

and $R_2$ is

6. The organic thin film transistor of claim 5, wherein $R_3$ and $R_4$ are independently hydrogen.

7. The organic thin film transistor of claim 5, wherein $R_3$ and $R_4$ are independently —C≡C—Si(CH(CH$_3$)$_2$)$_3$.

8. The organic thin film transistor of claim 1, wherein said halogen-containing group is CF$_3$, F, or Cl.

9. The organic thin film transistor of claim 1, wherein said ester group is H$_3$C—O—(C=O)— or F$_3$C—O—(C=O)—.

10. The organic thin film transistor of claim 1, wherein $R_5$ and $R_8$ are the same functional group.

11. The organic thin film transistor of claim 10, wherein $R_6$ and $R_7$ are the same functional group.

12. The organic thin film transistor of claim 1, wherein $R_5$ and $R_6$ are the same functional group.

13. The organic thin film transistor of claim 12, wherein $R_7$ and $R_8$ are the same functional group.

14. The organic thin film transistor of claim 1, wherein $R_5$, $R_6$, $R_7$ and $R_8$ are the same functional group.

15. The organic thin film transistor of claim 1, wherein $R_7$ and $R_8$ together form —(C=O)—O—(C=O)—, and $R_5$ and $R_6$ are the same functional group.

16. The organic thin film transistor of claim 1, wherein $R_5$ and $R_6$ together form

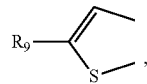

and $R_7$ and $R_8$ together form

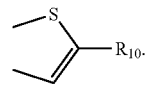

17. The organic thin film transistor of claim 2, wherein said hydrophilic layer is made of 3-aminopropyl-triethoxysilane.

18. The organic thin film transistor of claim 3, wherein said hydrophobic layer is made of a material selected from the group consisting of 1-dodecanethiol, 1-octanethiol, 1-hexadecanethiol, 2-butanethiol, and combinations thereof.

* * * * *